United States Patent
Lin et al.

(10) Patent No.: US 9,666,487 B2
(45) Date of Patent: May 30, 2017

(54) METHOD FOR MANUFACTURING GERMANIUM-BASED CMOS COMPRISING FORMING SILICON CAP OVER PMOS REGION HAVING A THICKNESS LESS THAN THAT OVER NMOS REGION

(71) Applicant: Taiwan Semiconductor Manufacturing Company, Ltd., Hsin-Chu (TW)

(72) Inventors: Jing-Cheng Lin, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/264,271

(22) Filed: Sep. 14, 2016

(65) Prior Publication Data

US 2017/0005010 A1 Jan. 5, 2017

Related U.S. Application Data

(63) Continuation of application No. 12/617,026, filed on Nov. 12, 2009, now abandoned.

(60) Provisional application No. 61/146,202, filed on Jan. 21, 2009.

(51) Int. Cl.
*H01L 21/8238* (2006.01)
*H01L 27/092* (2006.01)
*H01L 21/8234* (2006.01)

(52) U.S. Cl.
CPC ........... *H01L 21/823807* (2013.01); *H01L 21/823412* (2013.01); *H01L 21/823814* (2013.01); *H01L 21/823857* (2013.01); *H01L 27/092* (2013.01)

(58) Field of Classification Search
CPC ..... H01L 21/823412; H01L 21/823807; H01L 21/823814; H01L 21/823857; H01L 27/092
See application file for complete search history.

(56) References Cited

U.S. PATENT DOCUMENTS

| | | |
|---|---|---|
| 6,271,551 B1 | 8/2001 | Schmitz et al. |
| 6,605,498 B1 | 8/2003 | Murthy et al. |
| 6,881,635 B1 | 4/2005 | Chidambarrao et al. |
| 6,881,835 B2 | 4/2005 | Bai et al. |
| 6,977,400 B2 | 12/2005 | Puchner et al. |
| 7,148,526 B1 | 12/2006 | An et al. |
| 7,195,985 B2 | 3/2007 | Murthy et al. |

(Continued)

OTHER PUBLICATIONS

Brammertz, G., et al., "GaAs on Ge for CMOS," IMEC, 2007, 21 pages.

(Continued)

*Primary Examiner* — Anh Mai
(74) *Attorney, Agent, or Firm* — Slater Matsil, LLP

(57) ABSTRACT

A semiconductor structure includes a germanium substrate having a first region and a second region. A first silicon cap is over the first region of the germanium substrate. A second silicon cap is over the second region of the germanium substrate, wherein a first thickness of the first silicon cap is less than a second thickness of the second silicon cap. A PMOS device includes a first gate dielectric over the first silicon cap. An NMOS device includes a second gate dielectric over the second silicon cap.

20 Claims, 7 Drawing Sheets

(56) References Cited

U.S. PATENT DOCUMENTS

| | | | |
|---|---|---|---|
| 7,217,603 B2 | 5/2007 | Currie et al. | |
| 7,221,006 B2 | 5/2007 | Orlowski et al. | |
| 7,244,958 B2 | 7/2007 | Shang et al. | |
| 7,247,535 B2 | 7/2007 | Jain | |
| 7,358,551 B2 | 4/2008 | Chidambarrao et al. | |
| 7,387,925 B2 | 6/2008 | Shang et al. | |
| 7,449,379 B2* | 11/2008 | Ochimizu | H01L 21/76281 257/E21.633 |
| 7,525,161 B2 | 4/2009 | Ieong et al. | |
| 7,888,747 B2* | 2/2011 | Hokazono | H01L 21/823412 257/392 |
| 8,735,303 B2* | 5/2014 | Thees | H01L 21/823412 257/E21.284 |
| 2004/0173815 A1 | 9/2004 | Yeo et al. | |
| 2005/0093084 A1 | 5/2005 | Wang et al. | |
| 2005/0133819 A1* | 6/2005 | Kawasaki | H01L 21/823807 257/195 |
| 2005/0136584 A1* | 6/2005 | Boyanov | H01L 29/78 438/199 |
| 2005/0151134 A1* | 7/2005 | Hsu | H01L 21/823807 257/66 |
| 2006/0081875 A1 | 4/2006 | Lin et al. | |
| 2006/0237746 A1 | 10/2006 | Orlowski et al. | |
| 2007/0131969 A1 | 6/2007 | Sanuki et al. | |
| 2007/0148939 A1 | 6/2007 | Chu et al. | |
| 2007/0190730 A1 | 8/2007 | Huang et al. | |
| 2007/0235802 A1 | 10/2007 | Chong et al. | |
| 2008/0194072 A1 | 8/2008 | Yu et al. | |
| 2008/0194087 A1 | 8/2008 | Yu et al. | |
| 2009/0227078 A1 | 9/2009 | Chen et al. | |
| 2010/0155790 A1 | 6/2010 | Lin et al. | |

OTHER PUBLICATIONS

Brotzmann, S., et al., "Intrinsic and Extrinsic Diffusion of Phosphorus, Arsenic, and Antimony in Germanium," Journal of Applied Physics 103, 2008, pp. 033508-033508-7.

Cheng, C. C., et al., "Ultrathin Si Capping Layer Suppresses Charge Trapping in HfOxNy/Ge Metal-Insulator-Semiconductor Capacitors," Applied Physics Letter 90, 2007, pp. 012905-012905-3.

Chui, C. O., et al., "Activation and Diffusion Studies of Ion-Implanted p and n Dopants in Germanium," Applied Physics Letters, Oct. 20, 2003, vol. 83, No. 16, pp. 3275-3277.

Chui, C. O., et al., "Germanium n-Type Shallow Junction Activation Dependences," Applied Physics Letters 87, 2005, pp. 091909-091909-3.

Goel, N., et al., "Addressing the Gate Stack Challenge for High Mobility InxGa1-xAs Channels for n-FETs," IEDM, Dec. 16, 2008, 53 pages.

Kita, K., et al., "Direct Evidence of GeO Volatilization from GeO2/Ge and Impact of Its Suppression on GeO2/Ge Metal-Insulator-Semiconductor-Characteristics," Japanese Journal of Applied Physics, 2008, pp. 2349-2353, vol. 47, No. 4.

Koike, M., et al., "Diffusion and Activation of n-Type Dopants in Germanium," arXiv:cond-mat/0703708v3, Sep. 28, 2007, 6 pages.

Kuzum, D., et al., "Interface-Engineered Ge (100) and (111), N- and P-FETs with High Mobility," IEEE, 2007, pp. 723-726.

Lee, M. L. et al. "Strained Si, SiGe, and Ge Channels for High-Mobility Metal-Oxide-Semiconductor Field-Effect Transistors," Journal of Applied Physics 97, pp. 011101-27, 2005, 27 pages.

Lee, M. L. et al. "Strained Ge Channel p-Type Meta-Oxid-Semiconductor Field-Effect Transistors Grown on $Si^1$-x . Gex/Si Virtual Substrates," Applied Physics Letters, Nov. 12, 2001, vol. 79, No. 20, pp. 3344-3346.

Leys, F. E., et al., "Epitaxial Strained Si as a Passivation Method for the Ge/High-k Interface in Ge MOSFET Structures: Current Understanding and Future Directions," 2 pages.

Leys F., "Epitaxial Si as a Passivation Method for Ge(100): Process Development, Physical and Electrical Characterization," IMEC, EPI-Workshop, Apr. 22, 2008, pp. 1-30.

Miotto, R., et al., "First-Principles Study of the Adsorption of PH3 on Ge(001) and Si(001) Surfaces," Brazilian Journal of Physics, Jun. 2002, 7 pages, vol. 32, No. 2a.

Mitard, J., et al., "Record Ion/Ioff Performance for 65nm Ge pMOSFET and Novel Si Passivation Scheme for Improved EOT Scalability," 4 pages.

Mitard, J., et al., "Si-interface in Ge Devices: Process Window for Optimal Performance$ IMEC; Explore: Ge III-V Program," 2007, 30 pages.

Nicholas, G., et al., "High Mobility Strained Ge pMOSFETs with High-?/Metal Gate," IEEE Electron Device Letters, Sep. 2007, pp. 825-827, vol. 28, No. 9.

Palmer, M. J., et al., "Effective Mobilities in Pseudomorphic Si/SiGe/Si ?-channel Metal-Oxide-Semiconductor Field-Effect Transistors with Thin Silicon Capping Layers," American Institute of Physics, Mar. 5, 2001, pp. 1424-1426, vol. 78, No. 10.

Pourtois, G., et al., "A Step Towards a Better Understanding of Silicon Passivated (100) Ge P-Channel Devices," IMEC, ECS Spring Meeting, 2007, 29 pages.

Prabhakaran, K., et al., "Distinctly Different Thermal Decomposition Pathways of Ultrathin Oxide Layer on Ge and Si Surfaces," Applied Physics Letters, Apr. 17, 2000, vol. 76, No. 16, pp. 2244-2246.

Prabhakaran, K., et al., "In Situ Oxidation of a Thin Layer of Ge on Si(001): Observation of GeO to SiO2 Transition," Applied Phys. Lett., Feb. 22, 1993, pp. 864-866, vol. 62, No. 8.

Sareen, A., et al., "Effect of Si Cap Layer on Parasitic Channel Operation in Si/SiGe Meta-Oxid-Semiconductor Structures," Journal of Applied Physics, Mar. 15, 2003, vol. 93, No. 6, pp. 3545-3552.

Satta, A., et al., "Diffusion, Activation, and Regrowth Behavior of High Dose P Implants in Ge," Applied Physics Letters 88, 2006, pp. 162118-162118-3.

Satta, A., et al., "P Implantation Doping of Ge: Diffusion, Activation, and Recrystallization," J. Vac. Sci. Technol. B vol. 24(1), Jan./Feb. 2006, pp. 494-498.

Shang, H., et al., "Channel Design and Mobility Enhancement in Strained Germanium Buried Channel MOSFETs," 2004 Symposium on VLSI Technology Digest of Technical Papers, IEEE, pp. 204-205.

Wang, Y., et al., "Optimized Si-Cap Layer Thickness for Tensile-Strained-Si/Compressively Strained SiGe Dual-Channel Transistors in 0.13 μm Complementary Metal Oxide Semiconductor Technology," Japanese Journal of Applied Physics, 2005, pp. L 1248-L 1251, vol. 44, No. 40.

Weber, O., et al., "Strained Si and Ge MOSFETs with High-K/Metal Gate Stack for High Mobility Dual Channel CMOS," IEEE, 2005, 4 pages.

N. Wu et al., "BTI and Charge Trapping in Germanium p- and n-MOSFETs with CVD Hf02 Gate dielectric," IEEE 2005, 4 pages.

Yeo, C. C., et al., "Metal Gate/High-K Dielectric Stack on Si Cap/Ultra-Thin Pure Ge epi/Si Substrate," IEEE, 2005, pp. 107-110.

Zhang, Q. et al., "Drive-Current Enhancement in Ge n-Channel MOSFET Using Laser Annealing for Source/Drain Activation," IEEE Electron Device Letters, Sep. 2006, pp. 728-730, vol. 27, No. 9.

* cited by examiner

METHOD FOR MANUFACTURING GERMANIUM-BASED CMOS COMPRISING FORMING SILICON CAP OVER PMOS REGION HAVING A THICKNESS LESS THAN THAT OVER NMOS REGION

PRIORITY CLAIM AND CROSS-REFERENCE

This application is a continuation of U.S. patent application Ser. No. 12/617,026, entitled "Germanium-Based CMOS Comprising Silicon Cap Formed Over PMOS Region Having A Thickness Less Than That Over NMOS Region," filed on Nov. 12, 2009, which application claims the benefit of U.S. Provisional Application No. 61/146,202 filed on Jan. 21, 2009, entitled "Methods for Forming NMOS and PMOS Devices on Germanium-Based Substrates," which applications are hereby incorporated herein by reference.

CROSS-REFERENCE TO RELATED APPLICATION

This application relates to commonly-assigned U.S. patent application Ser. No. 12/341,674, filed Dec. 22, 2008, and entitled "N-FET with a Highly Doped Source/Drain and Strain Booster," which application is hereby incorporated herein by reference.

TECHNICAL FIELD

This invention relates generally to integrated circuit devices, and more particularly to CMOS devices and methods for forming the same.

BACKGROUND

Germanium is a commonly known semiconductor material. The electron mobility and hole mobility of germanium are greater than that of silicon, hence making germanium an excellent material in the formation of integrated circuits. However, in the past, silicon gained more popularity since its oxide (silicon oxide) is readily usable in the gate dielectric of metal-oxide-semiconductor (MOS) transistors. The gate dielectrics of the MOS transistors can be conveniently formed by thermal oxidation of silicon substrates. The oxide of germanium, on the other hand, is soluble in water, and hence is not suitable for the formation of gate dielectrics. Particularly, germanium oxides can easily evaporate at temperatures higher than about 430° C., and germanium may easily diffuse to neighboring silicon layers. This poses problems since the manufacturing processes of the MOS transistors often involve annealing temperatures of about 600° C. or above.

With the use of high-k dielectric materials in the gate dielectrics of MOS transistors, the convenience provided by silicon oxide is no longer a dominating advantage, and hence germanium is reexamined for use in integrated circuits. However, a further challenge faced by the semiconductor industry is that it is difficult to integrate PMOS devices formed on germanium layers or substrates with NMOS devices that are formed on high-electron-mobility materials. Research has been conducted to solve this problem. For example, in one of the proposed solutions, a germanium layer or a compound semiconductor layer formed of group III and group V elements (also known as III-V materials) may be formed on a silicon substrate. A III-V region may further be formed on top of the germanium layer or the compound semiconductor layer for an NMOS device, while a germanium region may be formed on top of the germanium layer or the compound semiconductor layer for a PMOS device. In another proposed solution, a germanium layer is formed on a silicon substrate. A silicon region is then formed on the germanium layer for an NMOS device, and a germanium region is formed on the germanium layer for a PMOS device. However, these solutions face problems such as lattice mismatch between substrates and the materials grown thereon, and increased manufacturing cost due to increased process steps. What is needed, therefore, is a method for overcoming the above-described shortcomings in the prior art.

SUMMARY OF THE INVENTION

In accordance with one aspect of the present invention, a semiconductor structure includes a germanium substrate having a first region and a second region. A first silicon cap is over the first region of the germanium substrate. A second silicon cap is over the second region of the germanium substrate, wherein a first thickness of the first silicon cap is less than a second thickness of the second silicon cap.

In accordance with another aspect of the present invention, a semiconductor structure includes a germanium substrate including a top layer formed of substantially pure germanium, wherein the top layer has a first region and a second region. A PMOS device includes a first silicon cap over the first region of the germanium substrate, and a first gate dielectric over the first silicon cap. An NMOS device includes a second silicon cap over the second region of the germanium substrate, and a second gate dielectric over the second silicon cap. A first thickness of the first silicon cap is less than a second thickness of the second silicon cap. The second thickness is less than about 22 mono-layers of silicon (ML).

In accordance with yet another aspect of the present invention, a method of forming a semiconductor structure includes providing a germanium substrate including a first region and a second region; forming a first silicon cap over the first region of the germanium substrate; and forming a second silicon cap over the second region of the germanium substrate. A first thickness of the first silicon cap is less than a second thickness of the second silicon cap.

In accordance with yet another aspect of the present invention, a method of forming a semiconductor structure includes providing a germanium substrate including a first region and a second region; masking the second region; selectively growing a first silicon cap from the first region of the germanium substrate; oxidizing a top layer of the first silicon cap to form a silicon oxide layer, wherein the first silicon cap has a first thickness after the step of oxidizing; and selectively growing a second silicon cap from the second region of the germanium substrate. The second silicon cap has a second thickness different from the first thickness. The method further includes forming an NMOS device including forming a first gate dielectric over a thicker silicon cap among the first silicon cap and the second silicon cap; and forming a PMOS device including forming a second gate dielectric over a thinner silicon cap among the first silicon cap and the second silicon cap.

The advantageous features of the embodiments of the present invention include improved performance for both PMOS and NMOS devices. Adverse effects such as the segregation and the oxidation of germanium are reduced due to the formation of silicon caps.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A method for forming a complementary metal-oxide-semiconductor (CMOS) device is provided. The intermediate stages of manufacturing embodiments of the present invention are illustrated. Throughout various views and illustrative embodiments of the present invention, like reference numbers are used to designate like elements.

Figure 1:
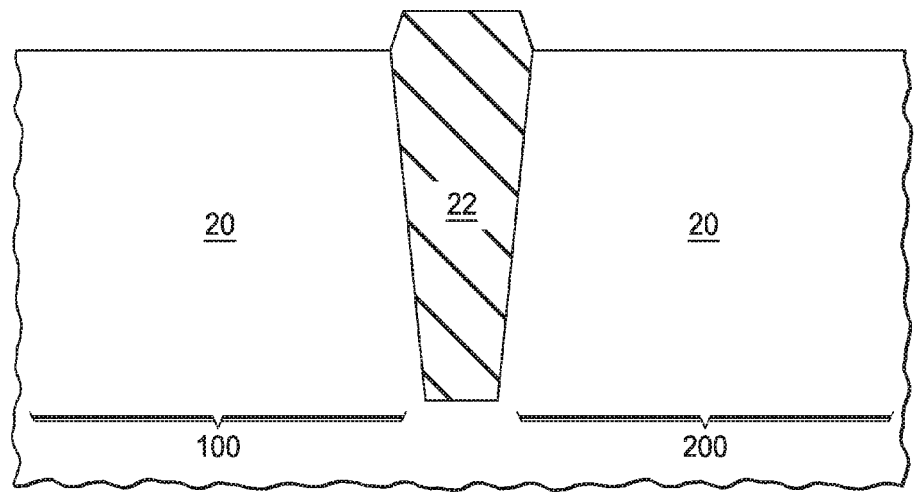
FIGS. 1 through 12B illustrate cross-sectional views of embodiments of the present invention.

Referring to FIG. 1, semiconductor substrate 20 is provided. Semiconductor substrate 20 may be formed of a germanium-containing semiconductor material, which may be expressed as $Si_{1-x}Ge_x$, wherein x is the atomic percentage of germanium. The materials of semiconductor substrate 20 may also be pure germanium or substantially pure germanium, for example, with a germanium atomic percentage greater than about 95 percent, or even greater than about 99 percent. Further, semiconductor substrate 20 may be a bulk substrate or have a layered structure such as germanium-on-silicon, germanium-on-insulator, or the like. Semiconductor substrate 20 includes PMOS region 100 and NMOS region 200, which may be defined by insulation regions such as shallow trench isolation (STI) region 22.

Figure 2:
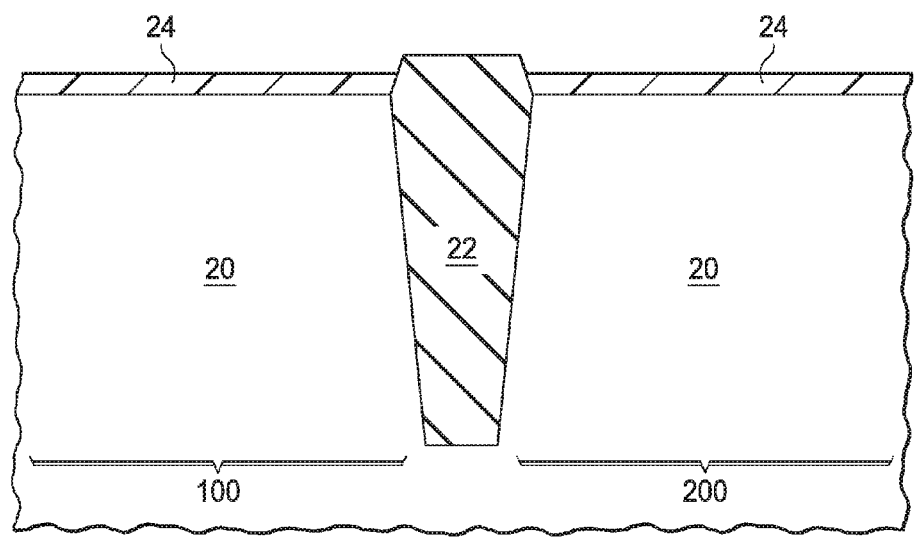

Referring to FIG. 2, mask layer 24, which may comprise silicon oxide or silicon nitride, is formed. In an embodiment, mask layer 24 comprises silicon oxide, and may be formed using a chemical vapor deposition (CVD) method. In alternative embodiments, mask layer 24 comprises silicon nitride and may be formed using, for example, low-pressure chemical vapor deposition (LPCVD). In yet other embodiments, mask layer 24 is formed by thermal nitridation of silicon or plasma anodic nitridation.

Figure 3:
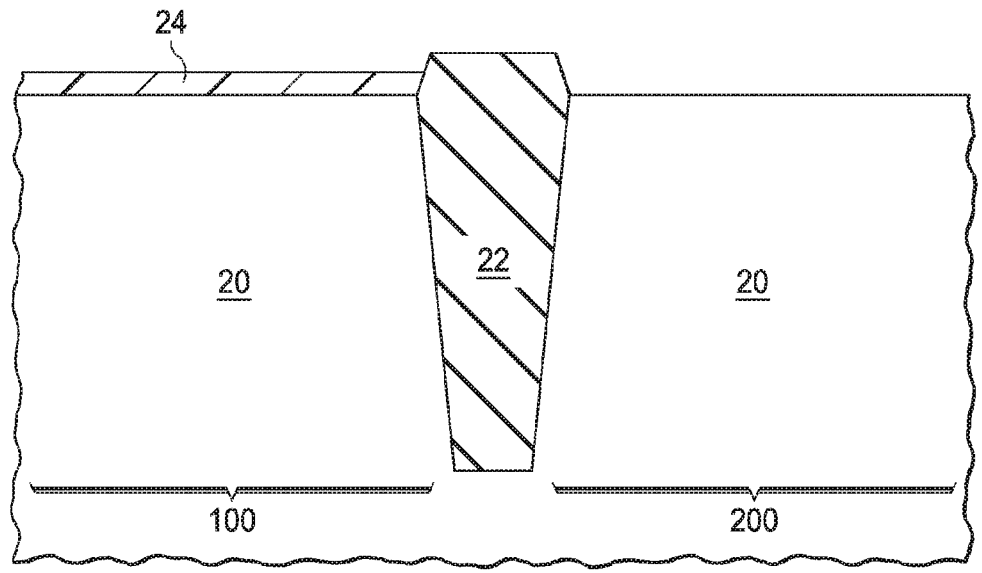

Referring to FIG. 3, the portion of mask layer 24 in NMOS region 200 is removed, while the portion of mask layer 24 in PMOS region 100 remains un-removed. The removal step may be performed by masking the portion of mask layer 24 in PMOS region 100, for example, using a photo resist (not shown), and performing a wet etch on the exposed portion of mask layer 24. The etchant may include hot $H_3PO_4$ if mask layer 24 is formed of silicon nitride. Otherwise, if mask layer is formed of silicon oxide, HF may be used.

Figure 4:
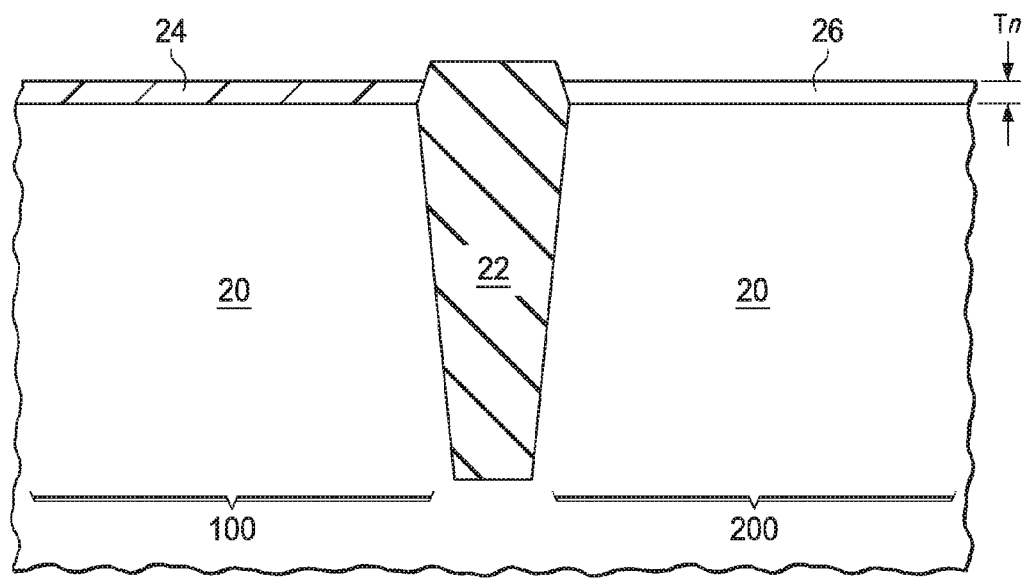

Referring to FIG. 4, silicon cap 26 is formed on the exposed surface of substrate 20, for example, using selective epitaxial growth (SEG), wherein no silicon cap 26 is formed on mask layer 24. Silicon cap 26 may include pure silicon or substantially pure silicon, for example, with a silicon atomic percentage greater than about 95 percent, or even greater than about 99 percent, although it may comprise a small amount of other elements, such as germanium. In an embodiment, thickness Tn of silicon cap 26 is less than about 22 mono-layers (ML, or in other words, includes fewer than about 22 mono-layers of silicon atoms), which is about 18Å. Thickness Tn may also be between about 12 ML and about 22 ML, although other thicknesses may also be used. It is realized that 22 ML is roughly the maximum thickness of silicon that may be epitaxially grown on germanium without causing relaxation. If the thickness of silicon cap 26 is greater than about 22 ML, due to the lattice mismatch between silicon and germanium, silicon relaxation may occur, and dislocations will be generated.

Figure 5:
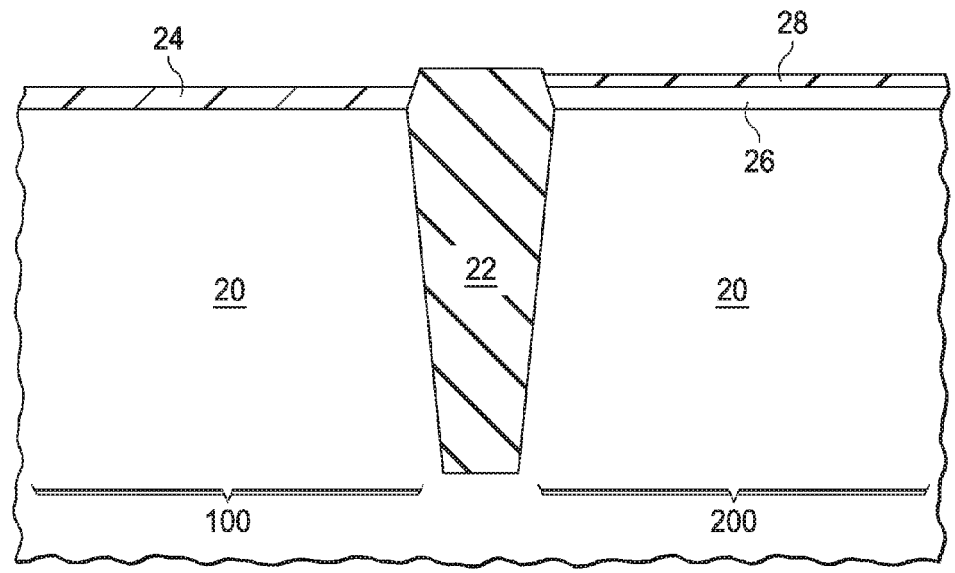

In FIG. 5, a thermal oxidation is performed on silicon cap 26, so that a top layer of silicon cap 26 is oxidized to form silicon oxide layer 28, although other methods such as deposition may also be used to form silicon oxide layer 28. The lower portion of silicon cap 26 remains un-oxidized. The oxidation may include, for example, low temperature plasma oxidation, with the temperature being lower than about 300° C. As a result, the amount of silicon cap 26 consumed in the oxidation may be as few as several mono-layers.

Figure 6:
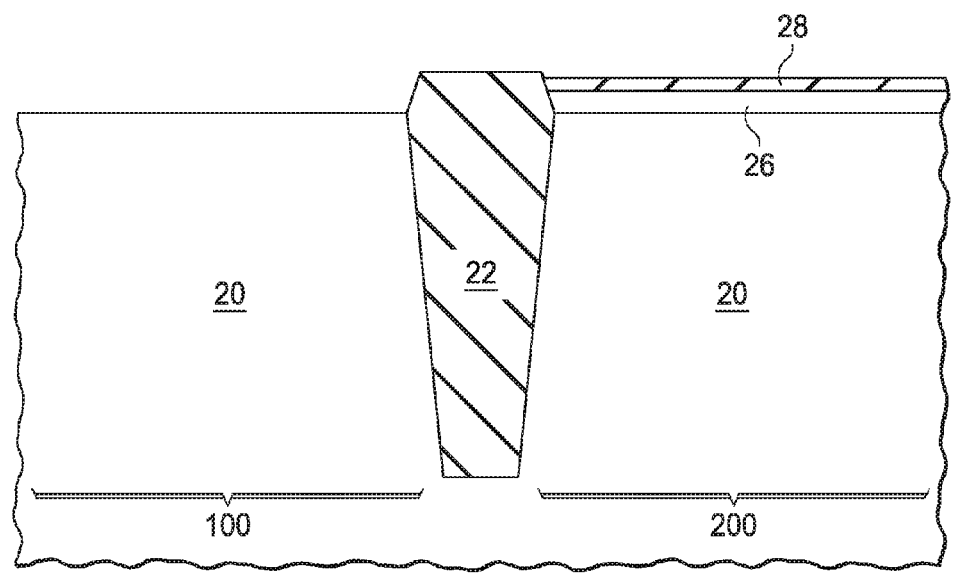
Figure 7:
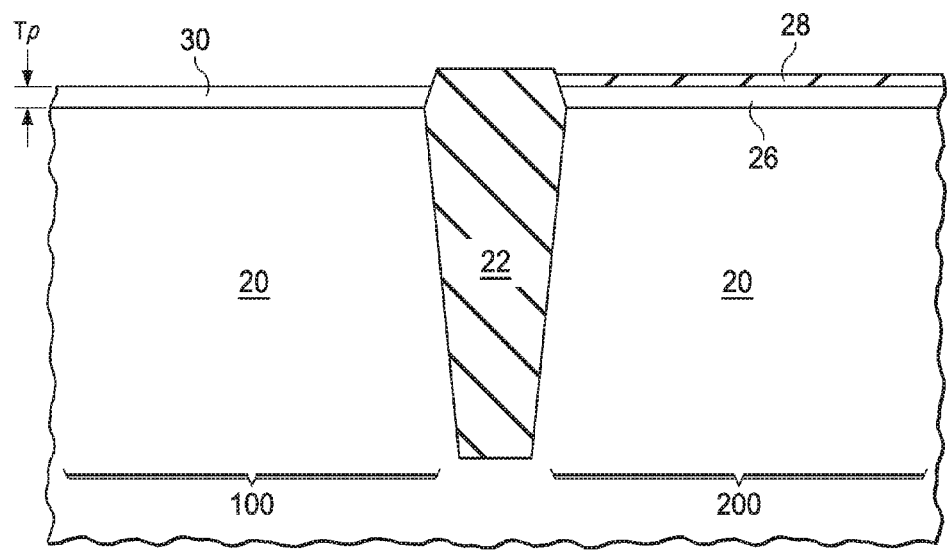

Referring to FIG. 6, the portion of mask layer 24 in PMOS region 100 is removed, followed by the epitaxial growth of silicon cap 30 on semiconductor substrate 20 in PMOS region 100, as shown in FIG. 7. Silicon cap 30 may be formed of essentially the same material as silicon cap 26, for example, pure silicon or substantially pure silicon. In an embodiment, silicon cap 30 has thickness Tp between about 4 ML and about 12 ML, although other thicknesses may also be used. Silicon oxide layer 28 is then removed, resulting in the structure as shown in FIG. 8.

Figure 8:
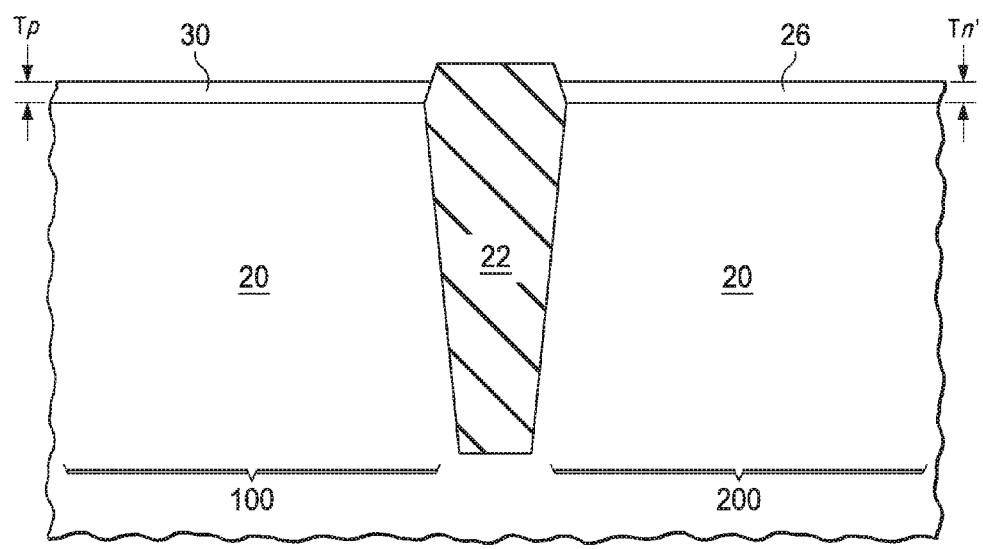

In the structure shown in FIG. 8, silicon caps 30 and 26 are formed in PMOS region 100 and NMOS region 200, respectively. The resulting thickness Tn' of silicon cap 26 may be between about 8 ML and about 16 ML. Preferably, thickness Tn' is greater than thickness Tp. In an embodiment, the thickness difference Tn'–Tp may be between about 2 ML and about 12 ML.

Figure 9:
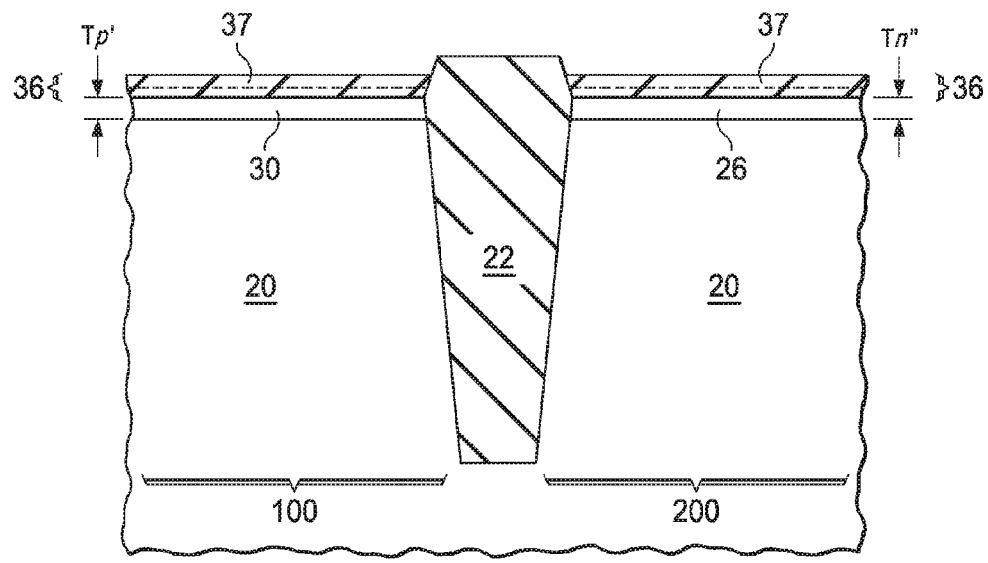

FIG. 9 illustrates the formation of gate dielectric layer 36. In an embodiment, gate dielectric layer 36 is formed of a high-k dielectric material. The exemplary high-k materials may have a k value greater than about 4.0, or even greater than about 7.0, and may include aluminum-containing dielectrics such as $Al_2O_3$, HfAlO, HfAlON, AlZrO, Hf-containing materials such as $HfO_2$, $HfSiO_x$, $HfAlO_x$, $HfZrSiO_x$, HfSiON, and other materials such as $LaAlO_3$ and $ZrO_2$. Gate dielectric layer 36 may also include oxides, nitrides, oxynitrides, multi-layers thereof, and combinations thereof.

In an embodiment in which high-k dielectric materials are used, silicon oxide ($SiO_2$) interlayer 37 may be formed between silicon caps 30 and 26 and the overlying high-k dielectric material. In the process steps subsequent to the step as shown in FIG. 9, the thicknesses of silicon caps 30 and 26 may be further reduced. For example, $SiO_2$ interlayer 37 may be formed by thermally oxidizing silicon caps 30 and 26, which may cause the thicknesses of silicon caps 30 and 26 to be further reduced, for example, by about 2 ML to about 6 ML. As a result, as shown in FIG. 9, the resulting thickness Tp' of silicon cap 30 may be between about 2 ML and about 8 ML, and the resulting thickness Tn" of silicon cap 26 may be between about 4 ML and about 14 ML, which thicknesses Tp' and Tn" are the final thicknesses of silicon caps 30 and 26, respectively. The thickness difference Tn"–Tp' may be between about 2 ML and about 12 ML.

Figure 10:
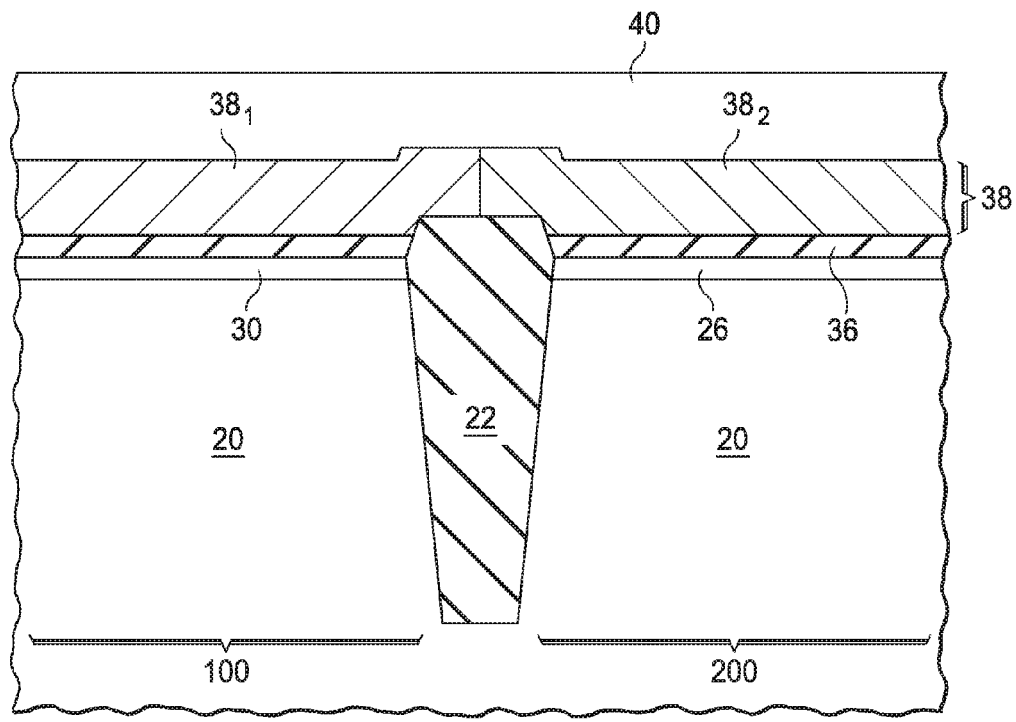

Next, as shown in FIG. 10, gate electrode layer 38 is formed. In an embodiment, gate electrode layer 38 comprises polysilicon. In other embodiments, gate electrode layer 38 may be formed of metals, metal nitrides, metal silicides, or the like. In yet other embodiments, gate electrode layer 38 may include first portion $38_1$ in PMOS region 100 and second portion $38_2$ in NMOS region 200. First portion $38_1$ of gate electrode layer 38 may have a work function suitable for forming PMOS devices, which work function is preferably between about 4.9 eV and about 5.2 eV, and may be a valence band-edge work function (close to the valence band of silicon, which is about 5.2 eV). The exemplary materials include tungsten-containing materials such as tungsten and tungsten nitride, ruthenium-containing materials such as ruthenium and ruthenium oxide, molybdenum-containing materials such as molybdenum and molybdenum nitride, or combinations thereof. The second portion $38_2$ of gate electrode layer 38 may have a work function suitable for forming NMOS devices, which work function is preferably between about 4.0 eV and about 4.4 eV, and may be a conduction band-edge work function (close to the conduction band of silicon, which is about 4.1 eV). The exemplary materials include tantalum-containing materials such as TaC, TaN, TaSiN, and combinations thereof. Hard mask layer 40, which may be formed of silicon nitride, is then formed.

Figure 11:
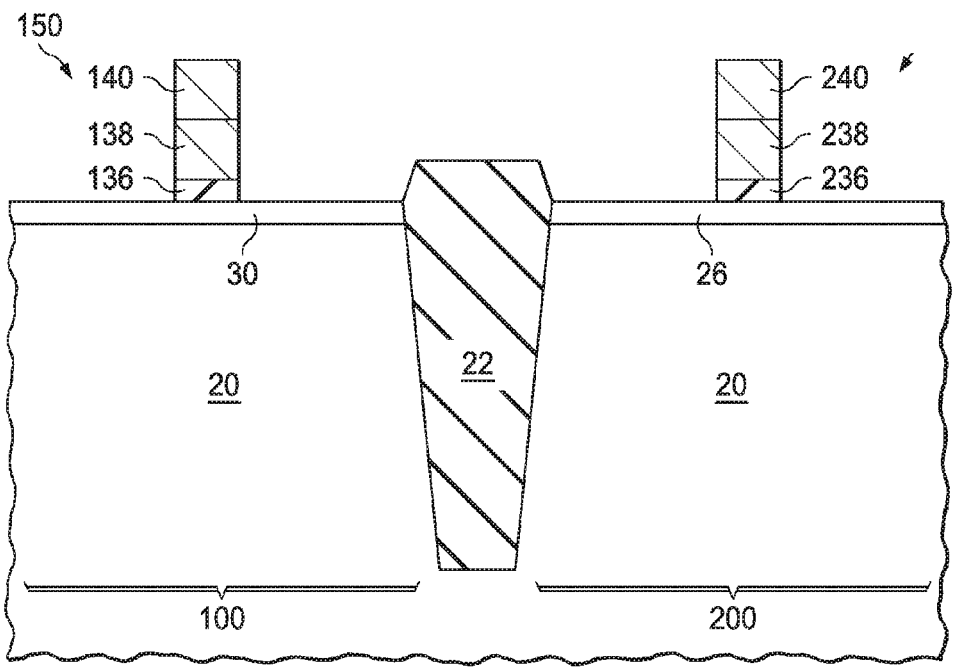

Next, as shown in FIG. 11, hard mask layer 40, gate electrode layer 38, and gate dielectric layer 36 are patterned, forming gate stacks 150 and 250. Gate stack 150 includes gate dielectric 136, gate electrode 138 and hard mask 140. Gate stack 250 includes gate dielectric 236, gate electrode 238 and hard mask 240.

Figure 12A:
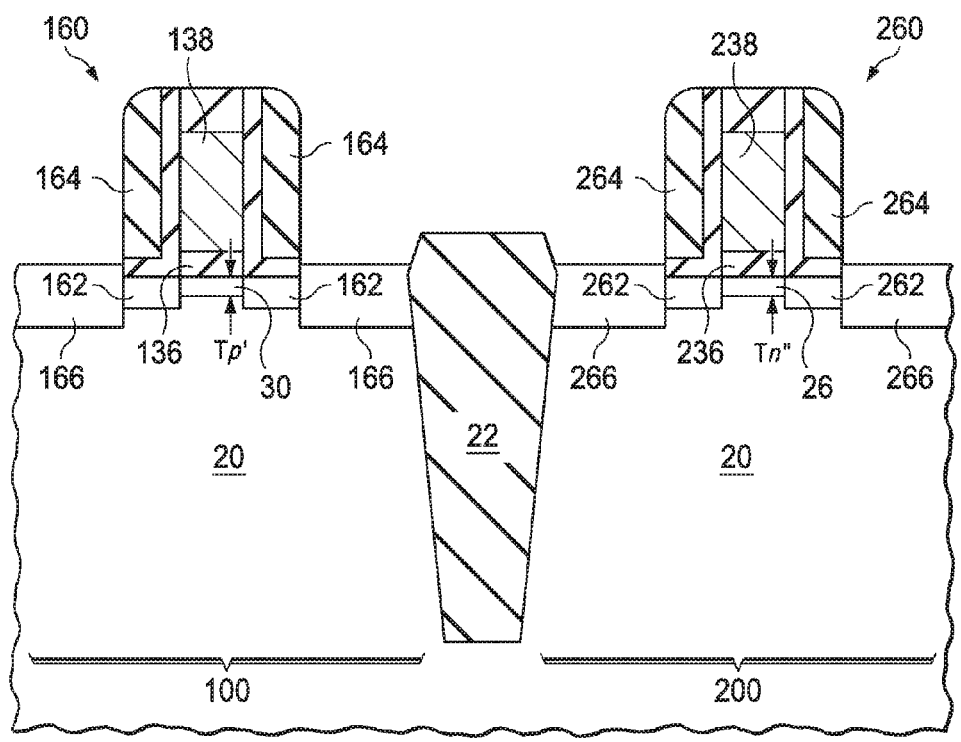

FIG. 12A illustrates the formation of the remaining components of PMOS device 160 and NMOS device 260. Lightly doped source/drain (LDD) regions 162 and 262 are formed. As is known in the art, LDD regions 162 and 262 may be formed by implanting n-type and p-type impurities into PMOS region 100 and NMOS region 200, respectively. Due to the masking of gate stacks 150 and 250, LDD regions 162 and 262 are substantially aligned to the edges of gate stacks 150 and 250, respectively.

Gate spacers 164 and 264 are formed on sidewalls of gate stacks 150 and 250, respectively. Preferably, gate spacers 164 and 264 are formed by depositing one or more spacer layer(s) (not shown), and removing horizontal portions of the spacer layer(s) by etching. In an embodiment, the spacer layers include a nitride layer on a liner oxide layer. The spacer deposition methods may include PECVD, LPCVD, sub-atmospheric CVD (SACVD), and the like.

FIG. 12A also illustrates the formation of deep source/drain regions 166 and 266. The formation processes for deep source/drain regions 166 and 266 are well known in the art, and thus are not repeated herein. Source/drain silicide regions (not shown) may then be formed on source/drain regions 166 and 266, and on gate electrodes 138 and 238 if gate electrodes 138 and 238 are formed of polysilicon.

In the resulting structure, PMOS device 160 and NMOS device 260 include silicon caps 30 and 26, respectively. However, silicon cap 26 is thicker than silicon cap 30. An advantageous feature of silicon caps 30 and 26 is that germanium substrate 20 is separated from gate dielectrics 136 and 236 by silicon caps 30 and 26, respectively, so that the likelihood of generating germanium oxide is substantially eliminated, and hence the traps that may be generated due to the germanium oxide are also eliminated. Reducing the thickness Tp of silicon cap 30 can result in the desirable reduction of equivalent oxide thickness (EOT) for PMOS device 160. On the other hand, the EOT of NMOS device 260 is substantially unaffected by the thickness of silicon cap 26. Accordingly, silicon cap 26 may be thicker than silicon cap 30 to take advantage of reduced diffusion of germanium to the surface of silicon cap 26 without incurring the increase in EOT of NMOS device 260.

It is realized that the steps discussed in the preceding paragraphs may be performed in different orders. For example, silicon cap 26 may be formed after the formation of silicon cap 30. Accordingly, silicon oxide layer 28 will be formed on silicon cap 30 and acts as a mask for selectively growing silicon cap 26. Further, other methods may also be used to differentiate the thicknesses of silicon caps 26 and 30, which methods are also in the scope of the embodiments of the present invention. For example, a silicon cap that has a thickness essentially the same as thickness Tp' (FIG. 12A) may be formed in both PMOS region 100 and NMOS region 200. The PMOS region 100 is then masked, for example, by a silicon oxide layer (not shown), and an additional epitaxial growth may then be performed to increase the thickness of silicon cap 26 to thickness Tn". One skilled in the art will realize the process details.

Figure 12B:
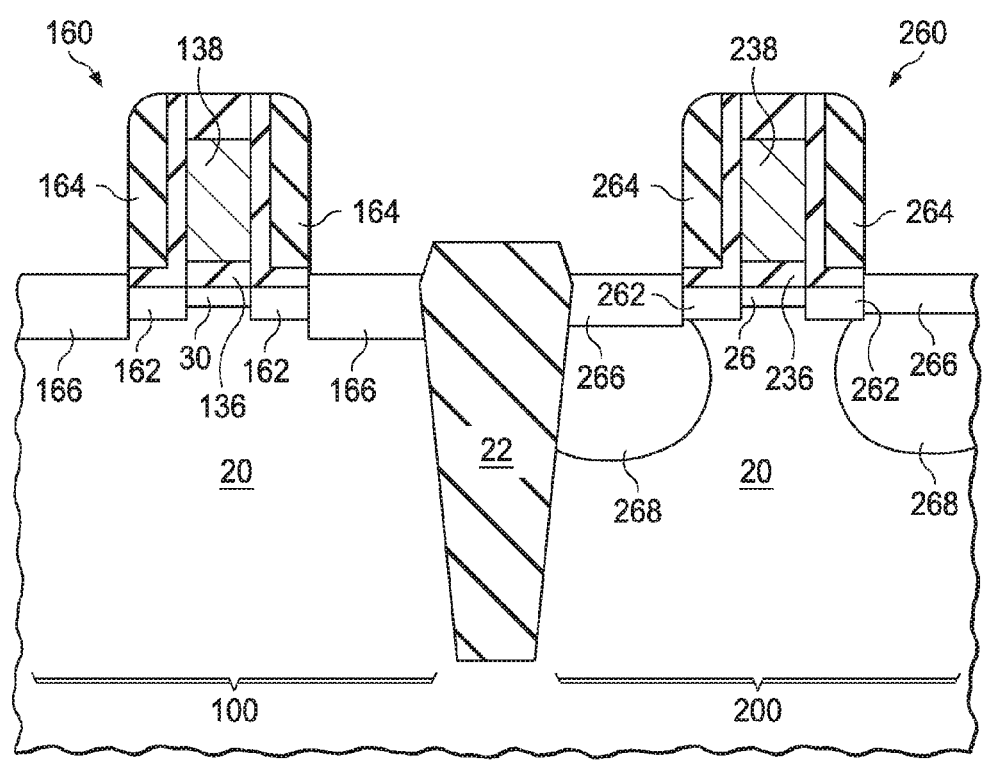

FIG. 12B illustrates an alternative embodiment, wherein SiGe stressors 268 are formed in semiconductor substrate 20 in NMOS region 200. SiGe stressors 268 form portions of source/drain regions 266 of NMOS device 260. In an embodiment, the germanium atomic percentage in SiGe stressors 268 is less than the germanium atomic percentage in semiconductor substrate 20, and hence SiGe stressors 268 may incur a tensile stress in the channel region of NMOS device 260. Further, SiGe stressors 268 may advantageously result in an increased solubility of the source/drain impurities in source/drain regions 266. In an embodiment, SiGe stressors 268 have a germanium atomic percentage between about 15 percent and about 85 percent, although different percentages are also usable.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method comprising:
   growing a first silicon cap over a germanium-containing substrate, wherein the germanium-containing substrate comprises a first portion and a second portion, and the first silicon cap is over the first portion of the germanium-containing substrate;
   oxidizing a top portion of the first silicon cap to form a silicon oxide layer;

using the silicon oxide layer as a mask to grow a second silicon cap over a second portion of the germanium-containing substrate; and removing the silicon oxide layer, wherein after the silicon oxide layer is removed, a first thickness of the first silicon cap is greater than a second thickness of the second silicon cap.

2. The method of claim 1 further comprising:
forming a first gate dielectric over the first silicon cap;
forming n-type source and drain regions on opposite sides of the first gate dielectric;
forming a second gate dielectric over the second silicon cap; and
forming p-type source and drain regions on opposite sides of the second gate dielectric.

3. The method of claim 2 further comprising:
forming a silicon germanium region in the germanium-containing substrate and adjacent to the first gate dielectric, wherein the silicon germanium region has a germanium atomic percentage less than an atomic percentage of the germanium-containing substrate.

4. The method of claim 1, wherein the second silicon cap has a first thickness, and wherein before the oxidizing, the first silicon cap has a second thickness, and after the oxidizing, the first silicon cap has a third thickness, and both the second thickness and the third thickness are greater than the first thickness.

5. The method of claim 1, wherein the first silicon cap and the second silicon cap are formed of substantially a same material.

6. The method of claim 1, wherein before the oxidizing, a thickness of the first silicon cap is smaller than about 22 ML, and after the oxidizing, the thickness of the first silicon cap is reduced to a range between about 4 ML and about 14 ML.

7. The method of claim 1, wherein the oxidizing the top portion of the first silicon cap comprises a thermal oxidation.

8. A method comprising:
performing a first epitaxy to grow a first silicon cap on a first portion of a substrate;
thinning the first silicon cap;
performing a second epitaxy to grow a second silicon cap on a second portion of the substrate, wherein the first epitaxy and the second epitaxy are performed in separate processes;
forming a first gate dielectric and a first gate electrode over the first silicon cap;
forming n-type source and drain regions on opposite sides of the first gate dielectric and the first gate electrode;
forming a second gate dielectric and a second gate electrode over the second silicon cap; and
forming p-type source and drain regions on opposite sides of the second gate dielectric.

9. The method of claim 8, wherein the thinning the first silicon cap comprises:

oxidizing a top portion of the first silicon cap to form an oxide layer; and
removing the oxide layer.

10. The method of claim 9, wherein when the second epitaxy is performed, the oxide layer covers the first silicon cap.

11. The method of claim 9, wherein after the first gate dielectric and the second gate dielectric are formed, the first silicon cap is thicker than the second silicon cap.

12. The method of claim 9, wherein the oxidizing the top portion of the first silicon cap comprises a thermal oxidation.

13. The method of claim 8, wherein the first silicon cap and the second silicon cap are formed of substantially a same material.

14. The method of claim 8, wherein the thinning the first silicon cap causes a thickness of the first silicon cap to reduce to a value in a range between about 4 ML and about 14 ML.

15. A method comprising:
forming a mask layer to mask a first portion and a second portion of a substrate;
removing the mask layer from the first portion of the substrate and leaving a portion of the mask layer over the second portion of the substrate;
performing a first epitaxy to grow a first silicon cap on the first portion of the substrate;
performing an oxidation on a top layer of the first silicon cap to form a silicon oxide layer, wherein the first silicon cap has a first thickness after the oxidation;
removing the portion of the mask layer over the second portion of the substrate;
selectively growing a second silicon cap on the second portion of the substrate, wherein the second silicon cap has a second thickness smaller than the first thickness;
forming an n-type transistor comprising forming a first gate dielectric over the first silicon cap; and
forming a p-type transistor comprising forming a second gate dielectric over the second silicon cap.

16. The method of claim 15, wherein the forming the n-type transistor further comprises forming a silicon germanium region in the substrate and adjacent to the first gate dielectric, wherein the silicon germanium region has a germanium atomic percentage less than an atomic percentage of the substrate.

17. The method of claim 15, wherein both the first silicon cap and the second silicon cap are grown as substantially pure silicon caps, and the first silicon cap and the second silicon cap are grown in separate epitaxy processes.

18. The method of claim 15, wherein the oxidation comprises a thermal oxidation.

19. The method of claim 18, wherein the oxidation is performed at a temperature lower than about 300° C.

20. The method of claim 15, wherein the oxidation is performed when the mask layer covers the second portion of the substrate.

* * * * *